United States Patent [19]
Nakagawara

[11] Patent Number: 5,111,154
[45] Date of Patent: May 5, 1992

[54] ANALOG FILTER

[75] Inventor: Chikashi Nakagawara, Kanagawa, Japan

[73] Assignee: Kabushiki Kaisha Toshiba, Kanagawa, Japan

[21] Appl. No.: 632,948

[22] Filed: Dec. 24, 1990

[30] Foreign Application Priority Data

Dec. 25, 1989 [JP] Japan .................................. 1-337560

[51] Int. Cl.⁵ .............................................. H03F 1/34
[52] U.S. Cl. ...................................... 330/85; 330/107; 330/294
[58] Field of Search .......................... 330/85, 107, 294; 307/520

[56] References Cited

U.S. PATENT DOCUMENTS 4,453,132 6/1984 Stamler ................................ 330/107

OTHER PUBLICATIONS

Y. Yamamoto et al., IEEE Transactions on Consumer Electronics, vol. 34, No. 3, Aug. 1988, pp. 443–451.

Primary Examiner—James B. Mullins
Attorney, Agent, or Firm—Finnegan, Henderson, Farabow, Garrett, and Dunner

[57] ABSTRACT

An analog active filter for realizing the secondary transfer function by using an amplifier having a feedback loop having a first integrating function block which integrates an input signal, second and third integrating function blocks which integrate an output signal, a first signal combining function block which combines signals from the first and second integrating function blocks with the input signal, a fourth integrating function block which integrates signals from the first signal combining function block, and a second signal combining function block which combines signals from the third and fourth integrating function blocks with the input signal and derives the output signal.

6 Claims, 6 Drawing Sheets

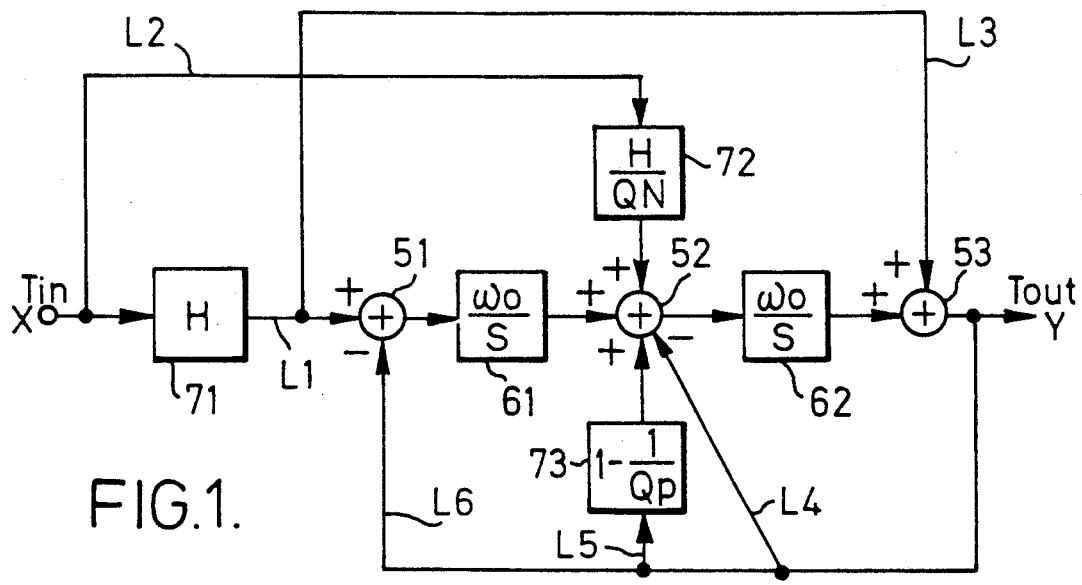
FIG.1.
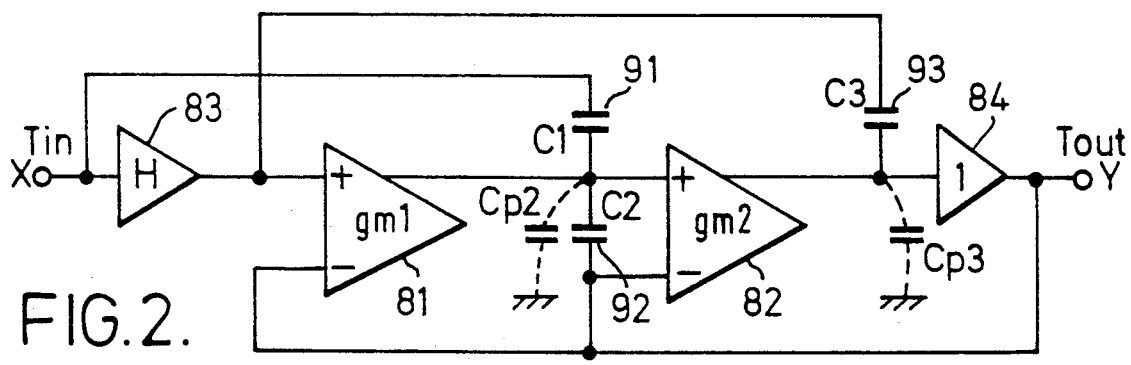
FIG.2.
FIG.3.
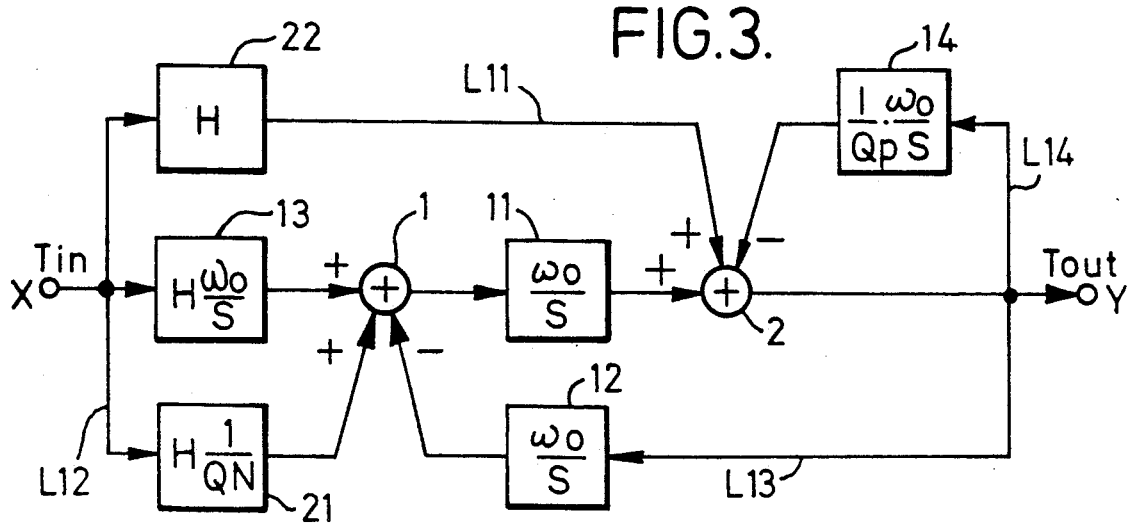

ANALOG FILTER

FIELD OF THE INVENTION

The present invention relates generally to an analog filter and, more particularly, to an analog filter which carries out a filter operation on analog signals by use of feedback.

BACKGROUND OF THE INVENTION

An active system, such as a biquad system, is known in the art for constituting analog filters. An analog filter made according to the biquad system is suitabe for use in an integrated circuit (referred to as IC hereafter). The biquad filter is used to obtain a desired filter characteristic by forming a circuit which realizes the secondary transfer function without using inductors but instead using an amplifier having a feedback loop.

Such an analog filter, e.g., a biquad filter, is widely used in color television fields, for instance, in a SECAM system color television system, in the form of a bell filter. The bell filter has a transfer function expressed by the following equation:

$$G(S) = H \cdot \frac{S^2 + \frac{\omega_0}{Q_N} \cdot S + \omega_0^2}{S^2 + \frac{\omega_0}{Q_P} \cdot S + \omega_0^2} \quad (1)$$

where, $\omega_0$ represents a natural angle frequency (e.g., 4.286 MHz);

H represents a gain coefficient (actual number);

S represents a complex number;

Qp represents a pole selectivity or a selectivity assigned for the denominator of the equation (1); and Qn represents a zero selectivity or a selectivity assigned for the numerator of the equation (1).

When assuming the gain G at the natural angle frequency of 0 dB, the gain coefficient H becomes Qn/Qp.

To embody the transfer function various biquad filters have been considered. For instance, Y. Yamamoto et al., IEEE Transactions on Consumer Electronics, Vol. 34, No. 3, August 1988, pp 443–451 shows show such a biquad filter (see FIGS. 3 and 5) and a video processor for color TV (see FIG. 2) using such a filter.

However, such a conventional biquad analog filter has problems as follows. The filter can not totally complete a differential operation. Furthermore, the filter is influenced by a parasitic capacitance when it is implemented on an IC device.

Additionally, the filter requires an impedance transformer for driving capacitors in integration circuits constituting the filter.

SUMMARY OF THE INVENTION

It is, therefore, an object of the present invention to provide an analog filter which can reduce the above problems in conventional filters.

In order to achieve the above object, an analog filter according to a first aspect of the present invention is a active filter having a first integrating function block which integrates an input signal, second and third integrating function blocks which integrate an output signal, a first signal combining function block which combines signals from the first and second integrating function blocks with the input signal, a fourth integrating function block which integrates signals from the first signal combining function block and a second signal combining function block which combines signals from the third and fourth integrating function blocks with the input signal and derives the output signal.

An analog filter according to a second aspect of the present invention is a low-pass filter having a first integrating function block which integrates an input signal, second and third integrating function blocks which integrate an output signal, a first signal combining function block which combines signals from the first and second integrating function blocks, a fourth integrating function block which integrates a signal from the first signal combining function block and a second signal combining function block which combines signals from the third and fourth integrating function blocks and derives the output signal.

An analog filter according to a third aspect of the present invention is a high-pass filter having first and second integrating function blocks which integrate an output signal, a third integrating function block which integrates a signal from the second integrating function block and a signal combining function block which combines signals from the first and third integrating function blocks with an input signal and derives the output signal.

An analog filter according to a fourth aspect of the present invention is a notch filter having a first integrating function block which integrates an input signal, second and third integrating function blocks which integrate an output signal, a first signal combining function block which combines signals from the first and second integrating function blocks, a fourth integrating function block which integrates a signal from the first signal combining function block and a second signal combining function block which combines signals from the third and fourth integrating function blocks with the input signal and derives the output signal.

An analog filter according to a fifth aspect of the present invention is a band-pass filter having first and second integrating function blocks which integrate an output signal, a first signal combining function block which combines an input signal and a signal from the second integrating function block, a third integrating function block which integrates a signal from the first signal combining function block and a second signal combining circuit which combines signals from the first and third integrating function blocks and derives the output signal.

An analog filter according to a sixth aspect of the present invention is an all-pass filter having a first integrating function block which integrates an input signal, second and third integrating function blocks which integrate an output signal, a first signal combining function block which combines signals from the first and second integrating function blocks with the input signal, a fourth integrating function block which integrates signals from the first signal combining function block and a second signal combining function block which combines signals from the third and fourth integrating function blocks with the input signal and derives the output signal.

Additional objects and advantages of the present invention will be apparent to persons skilled in the art from a study of the following description and the accompanying drawings, which are hereby incorporated in and constitute a part of this specification.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein:

FIG. 1 is a fuctional illustration showing an analog filter of related art

FIG. 2 is a circuit diagram showing the filter of FIG. 1.

FIG. 3 is a functional illustration showing an analog filter as a first embodiment of the present invention;

DESCRIPTION OF THE PREFERRED EMBODIMENTS

Figure 4:
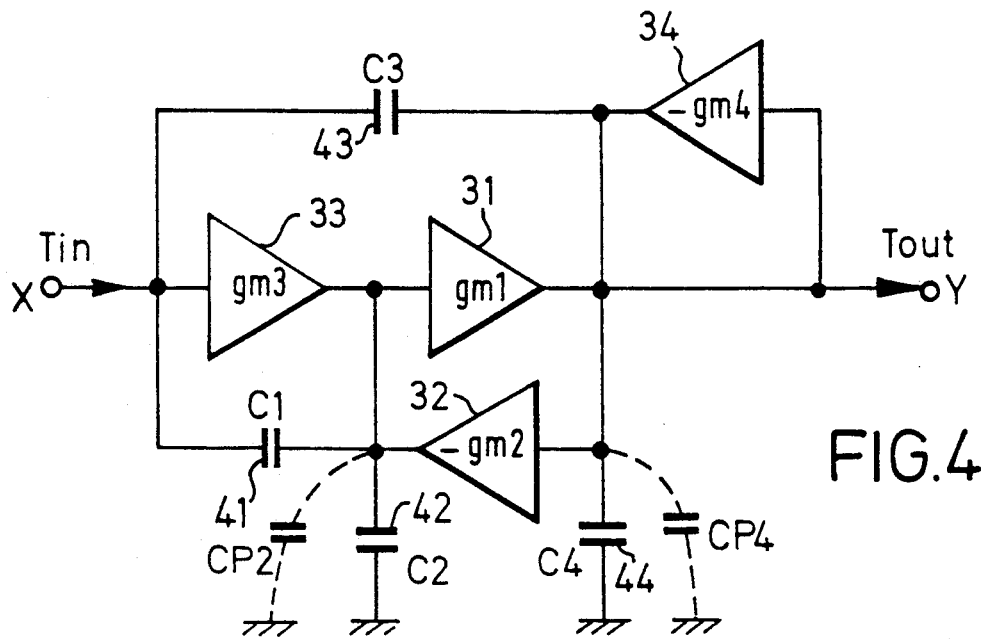
FIG. 4 is a circuit diagram showing the analog filter of FIG. 3.

The present invention will be described in detail with reference to FIGS. 1 through 15. Throughout the drawings, like or equivalent reference numerals or letters will be used to designate like or equivalent elements for simplicity of explanation.

Prior to the detailed descriptions of the present invention, an analog filter of related art will be described in brief in reference to FIGS. 1 and 2. FIGS. 1 and 2 show a fuctional arrangement and a circuit diagram of an analog filter, i.e., a biquad filter, which the named invention herein recently developed but which was not publicly known at the time of this application.

In FIG. 1, Tin is an input terminal for receiving an input signal X, while Tout is an output terminal for outputting an output signal Y. This filter has two integrating function blocks 61 and 62, three signal combining function blocks 51, 52 and 53, three feed-forward passes L1, L2 and L3, which feed the input signal X with a prescribed gain, and three feedback passes L4, L5 and L6, which feed back the output signal Y with a prescribed gain. The feed-forward pass L1 includes a coefficient function block 71 with a coefficient of H.

The feed-forward pass L2 includes a coefficient function block 72 with a coefficient of HQn. The feed-forward pass L3 has a coefficient of 1. The feedback pass L5 includes a coefficient function block 73 with a coefficient of $[1 - 1/Qp]$. The feedback passes L4 and L6 each have a coefficient of 1.

The analog biquad filter of FIG. 1 can well represent the function of the above-mentioned Equation (1).

The functional arrangement of the analog biquad filter, as shown in FIG. 1, can be realized by a practical circuit as shown in FIG. 2. In FIG. 2, differential type transconductance amplifiers (hereinafter referred to as Gm amplifiers) 81 and 82 correspond to the intgrating function blocks 61 and 62, respectively.

The input signal X on the input terimal Tin is applied to the non-inversed input terminal (+) of the front stage Gm amplifier 81 via an amplifier 83 which performs an impedance conversion as well as the function of the coefficient function block 71.

An output of the Gm amplifier 81 is then transmitted to the non-inversed input terminal of the rear stage Gm amplifier 82. An output of the rear stage Gm amplifier 82 is lead to the output terminal Tout through an impedance conversion amplifier 84 resulting in the output signal Y. A first capacitor 91, corresponding to the pass L2 of FIG. 1, is coupled between the input terminal Tin and a first connection node of the output terminal of the front stage Gm amplifier 82 and the non-inversed input (+) of the rear stage Gm amplifier 82. A second capacitor 92, corresponding to the pass L2 of FIG. 1, is coupled between the output terminal Tout and the first connection node. A third capacitor 93, corresponding to the pass L3 of FIG. 1, is coupled between the output terminal of the amplifier 83 and a second connection node of the output terminal of the rear stage Gm amplifier 82 and the impedance conversion amplifier 84.

The outuput signal Y is fed back to the inversed input terminals (−) of the Gm amplifiers 81 and 82, respectively. The capacitors 91, 92, 93 and the impedance conversion amplifier 84 define the gains of the passes L1 through L6 in FIG. 1.

When assuming that the transconductance of the front stage Gm amplifier 81 is Gm1, the transconductance of the rear stage Gm amplfier 82 is Gm2, and the capacitances of the capacitors 91, 92 and 93 are C1, C2 and C3, respectively, then the transfer function T(S) of the analog filter of FIG. 2 is expressed by the following equation:

$$T(S) = H \cdot \frac{S^2 + \frac{C_1 \cdot g_{m2}}{H \cdot (C_1 + C_2)C_3} S + \frac{g_{m1} \cdot g_{m2}}{(C_1 + C_2)C_3}}{S^2 + \frac{C_1 \cdot g_{m2}}{(C_1 + C_2) \cdot C_3} S + \frac{g_{m1} \cdot g_{m2}}{(C_1 + C_2)C_3}} \quad (2)$$

The parameters ωO, Qp and Qn in Equation (1) are expressed as follows, from the comparison of Equations (1) and (2):

$$\omega_0 = \sqrt{\frac{g_{m1} \cdot g_{m2}}{(C_1 + C_2) \cdot C_3}} \quad (3)$$

$$Q_P = \sqrt{\frac{(C_1 + C_2) \cdot C_3}{C_1^2} \cdot \frac{g_{m1}}{g_{m2}}}$$

-continued $$Q_N = H \sqrt{\frac{(C_1 + C_2) \cdot C_3}{C_1^2} \cdot \frac{g_{m1}}{g_{m2}}}$$

When assuming that $C_1 + C_2 = C_3 = C_0$, $G_{m1} = G_{m2} = G_{m0}$.

$$C_0 = \frac{g_{m0}}{\omega_0} \quad (4a)$$

$$C_1 = \frac{1}{Q_P} C_0 \quad (4b)$$

$$C_2 = \left(1 - \frac{1}{Q_P}\right) C_0 \quad (4c)$$

$$C_3 = C_0 \quad (4d)$$

$$H = \frac{Q_N}{Q_P} \quad (4e)$$

As seen from the above, Equations (4a) to (4d) have the ratio forms which are suitable for ICs, the parameters $\omega_0$, $Q_P$ and $Q_n$ in Equations (3a), (3b) and (3c) are determined based on the capacitance ratios. Thus, the analog filter of FIGS. 1 and 2 is suitable for implementation on ICs and presents extremely excellent characteristics.

However, the named inventor herein found from experiments on practical filters made on an IC substrate that the analog filter of FIGS. 1 and 2 still had problems as described below.

A first problem is caused by parasitic capacitances. There are such parasitic capacitances as collector substrate capacitances of transistors constituting the Gm amplifiers, a collector base capacitance, a wiring capacitance, etc. These parasitic capacitances have a large influence on the filter when they are formed on high impedance regions. In FIG. 2, parasitic capacitances CP2 and CP3 formed at positions shown by a dotted line cause the problems. The parasitic capacitance Cp2 is formed between the first connection node and a ground circuit. The parasitic capacitance Cp3 is formed between the second connection node and the ground circuit. When such parasitic capacitances CP2 and CF3 are formed, the transfer function Tp(S) is expressed by the following equation;

$$T_P(S) = \frac{C_3}{C_3 + C_{p3}} H \times$$

$$\frac{S^2 + \frac{C_1 \cdot g_{m2}}{(C_1 + C_2 + C_{p2}) \cdot C_3} S + \frac{g_{m1} \cdot g_{m2}}{(C_1 + C_2 + C_{p2}) \cdot C_3}}{S^2 + \frac{(C_1 + C_{p2}) \cdot g_{m2}}{(C_1 + C_2 + C_{p2})(C_3 + C_{p3})} S + \frac{g_{m1} \cdot g_{m2}}{(C_1 + C_2 + C_{p2})(C_3 + C_{p3})}} \quad (5)$$

When Equation (5) is compared with Equation (1), the parameters become as follows:

$$Q_P = \sqrt{\frac{(C_1 + C_2 + C_{p2})(C_3 + C_{p3})}{(C_1 + C_{p2})^2} \cdot \frac{g_{m1}}{g_{m2}}} \quad (6a)$$

$$Q_N = \sqrt{\frac{(C_1 + C_2 + C_{p2})}{C_1^2} \cdot \frac{g_{m1}}{g_{m2}}} \quad (6b)$$

$$\omega_P = \sqrt{\frac{g_{m1} \cdot g_{m2}}{(C_1 + C_2 + C_{p2})(C_3 + C_{p3})}} \quad (6c)$$

$$\omega_N = \sqrt{\frac{g_{m1} \cdot g_{m2}}{(C_1 + C_2 + C_{p2}) \cdot C_3}} \quad (6d)$$

As seen from the above equations, the parasitic capacitance Cp3 relates tot he equation (6c) for the pole natural angle frequency $\omega P$, but does not relate to the equation (6d) for the zero point natural angle frequency $\omega N$. Therefore, it is impossible to make the polar and the zero point natural frequencies $\omega P$ and $\omega N$ agree with the natural angle frequency $\omega O$. Accordingly, when a biquad filter is constructed in such structure as shown in FIG. 2, a deviation of the characteristic of the filter is unavoidable.

A second problem is that although the Gm amplifiers 81 and 82 have differential circuit configurations, two input signals applied to the non-inversed input terminal and the inversed input terminal of the respective Gm amplifiers 81 and 82 are not symmetrical with each other. When two asymmetrical input signals are input to the differential amplifier circuit, such as the Gm amplifiers 81 and 82, its frequency characteristic deteriorates.

In a bell filter its pole and zero selectivities Qp and Qn are defined to have values of 16 and $(1.6)^{\frac{1}{2}}$. That is, $Q_p = 16$ and $Q_n = (1.6)^{\frac{1}{2}}$. Therefore, if the Gm amplifiers 81 and 82 do not operate differentially, out of phase as an integration circuit will cause a large influence on the filter operation and the filter characteristic will deviate.

A third problem is that some capacitors are driven by voltage signals because the amplifier 83 with the gain of H and the amplifer 84 with the gain of 1 are a type of voltage signal outputting circuit, i.e., the amplifiers 83 and 84 have a very low impedance. Thus, the Gm amplifiers 81 and 82 exhibit a low-pass filter characteristic. Therefore, phase lags occur based on the output impedances of the amplifiers 83, 84 and the capacitances C3, C2 so that a deviation of the filter characteristic arises. Especially, in filters having a very large value of selectivity Q such as the bell filter, a phase lag in the amplifier 84 with the gain of 1 which is connected to the feedback passes L4, L5 and L6 largely affects its filter characteristic. In the excessive case, oscillation may occur in the filter.

Referring now to FIGS. 3 and 4, a first embodiment of the analog filter according to the present invention will be described in detail. The analog filter of FIGS. 3 and 4 is accomplished by further considerations for improving the analog filter of FIGS. 1 and 2.

In FIG. 3 the first embodiment of the analog filter is in the form of a bell filter. Feed-forward passes L11 and L12 for feeding forward an input signal X to be filtered and the feedback passes L13 and L14 for feeding back an output signal Y of the analog filter are connected to a main pass connected between an input terminal Tin and an output terminal Tout of the analog filter for applying a second order function on the input signal X.

In this main pass, a first integrating function block 13, a first signal combining function block 1, a fourth integrating function block 11 and a second signal combining function block 2 are connected in series. The first integrating function block 13 multiplies by H times the input signal X as well as integrates the input signal X. The first signal combining function block 1 combines the output from this first integrating function block 13 and signals from the passes L12 and L13 together, wherein the signal from the pass L13 is applied to the first signal combining function block 1 in the opposite phase to the phases of the other two signals. The fourth integrating function block 11 integrates the output from the first signal combining function block 1. The second signal combining function block 2 combines the output from the fourth integrating function block 11 and signals from the passes L11 and L14 together, wherein the signal from the pass L14 is applied to the second signal combining function block 2 in the opposite phase to the phases of the other two signals. The output from the second signal combining function block 2 becomes the output signal Y.

The feed-forward pass L11 has a coefficient function block 22 which multiplies H times the input signal X. The feed-forward pass L12 has a coefficient function block 21 which multiplies $H(1/Qn)$ times, i.e., Qn times the input signal X. The feedback pass L13 has a second integrating function block 12 which integrates the output signal Y. The feedback pass L14 has a third integrating function block 14 which multiplies $1/Qp$ times the output signal Y as well as integrates the output signal Y.

The above functional arrangement operates to accomplish the transfer function of Equation (1). Now, the operation of the FIG. 3 for accomplishing Equation (1) will be explained.

First, divide the denominator and numerater of Equation (1) by $S^2$, then a following equation (7) is obtained.

$$G(S) = H \cdot \frac{1 + \frac{1}{Q_N}\left(\frac{\omega_0}{S}\right) + \left(\frac{\omega_0}{S}\right)^2}{1 + \frac{1}{Q_P}\left(\frac{\omega_0}{S}\right) + \left(\frac{\omega_0}{S}\right)^2} = \frac{Y}{X} \quad (7)$$

Change Equation (7) as to its denominator, then a following equation (8) is obtained.

$$\left\{1 + \frac{1}{Q_P}\left(\frac{\omega_0}{S}\right) + \left(\frac{\omega_0}{S}\right)^2\right\}Y = H\left\{1 + \frac{1}{Q_N}\left(\frac{\omega_0}{S}\right) + \left(\frac{\omega_0}{S}\right)^2\right\}X \quad (8)$$

Move the third term in the left side of Equation (8) to the right side and rearrange it, then a following equation (9) is obtained.

$$\left\{1 + \frac{1}{Q_P}\left(\frac{\omega_0}{S}\right)\right\}Y = H\left\{1 + \frac{1}{Q_N}\left(\frac{\omega_0}{S}\right) + \left(\frac{\omega_0}{S}\right)^2\right\}X - \left(\frac{\omega_0}{S}\right)^2 Y = \quad (9)$$

-continued $$HX + \left(\frac{\omega_0}{S}\right)\left\{H\frac{1}{Q_N}X + H\left(\frac{\omega_0}{S}\right)X - \left(\frac{\omega_0}{S}\right)Y\right\}$$

Move the second term in the left side of Equation (9) to the right side, then a following equation (10) is obtained.

$$Y = HX + \left(\frac{\omega_0}{S}\right)\left\{H\frac{1}{Q_N}X + H\left(\frac{\omega_0}{S}\right)X - \left(\frac{\omega_0}{S}\right)Y\right\} - \frac{1}{Q_P}\left(\frac{\omega_0}{S}\right)Y \quad (10)$$

According to the above Equation (10), for instance, addition and subtraction arithmetic in parentheses, except for the term of the input signal X, is calculated based on only current signals output from the integrating function blocks. Thus, capacitance elements typically used in the integrating function blocks are driven by current signals only. Accordingly, the embodiment of FIG. 3 requires no impedance conversion circuit so that phase lags are avoided.

Furthermore, the arithmetic calculation for outputs from the integrating function blocks can be realized by simple line connections. Thus, the embodiment is not troubled by deviations of frequency characteristic caused by insufficient differential operation of differential circuits. Further, as an amplifier in which each integrating function block operates on one input and one output, it is possible to improve the frequency characteristic by constituting a full differential circuit.

FIG. 4 shows a practical circuit for realizing the bell filter of FIG. 3. The bell filter of FIG. 4 is implemented on ICs by Gm amplifiers and capacitors.

In FIG. 4, the first Gm amplifier 33 corresponds to the first integrating function block 13 of FIG. 3. The second Gm amplfier 32 corresponds to the second integrating function block 12. The third Gm amplfier 34 corresponds to the third integrating function block 14. The fourth Gm amplfier 31 corresponds to the fourth integrating function block 11. The transconductances of the first and fourth Gm amplifiers 33 and 31 are expressed in the positive expression, while the transconductances of the second and third Gm amplifiers 32 and 34 are expressed in the negative expression.

Capacitors 41 through 44 constitute integrating capacitances to the Gm amplifiers 31 through 34. The capacitor 41 is connected between the input terminal Tin and a first connection node of the first and fourth Gm amplifiers 33 and 31. The capacitor 42 is connected between the first connection node and the ground circuit. The capacitor 43 is connected between the input terminal Tin and a second connection node of the fourth and second Gm amplifier 31 and 32. The capacitor 44 is connected between the second connection node and the ground circuit.

When the transconductances of the above Gm amplifiers 31 through 34 are assumed to be Gm1, Gm2, Gm3 and Gm4 and the capacitances of the capacitors 41 through 44 to be C1, C2, C3 and C4, the transfer function T(S) of the bell filter of FIG. 4 is expressed as follows:

$$T(S) = \frac{C_3}{C_3 + C_4} \cdot \quad (11)$$

$$\frac{S^2 + \frac{C_1 \cdot g_{m1}}{(C_1 + C_2)C_3} S + \frac{g_{m1} \cdot g_{m3}}{(C_1 + C_2)C_3}}{S^2 + \frac{g_{m4}}{C_3 + C_4} S + \frac{g_{m1} \cdot g_{m2}}{(C_1 + C_2)(C_3 + C_4)}}$$

When Equation (11) is compared with Equation (1), the following parameters $\omega N$, $Qn$, $\omega N$ and $Qp$ are obtained:

$$\omega_N = \sqrt{\frac{g_{m1} \cdot g_{m2}}{(C_1 + C_2)C_3}} \quad (12)$$

$$\omega_P = \sqrt{\frac{g_{m1} \cdot g_{m2}}{(C_1 + C_2)(C_3 + C_4)}}$$

$$Q_N = \sqrt{\frac{(C_1 + C_2)C_3}{C_1^2} \cdot \frac{g_{m3}}{g_{m1}}}$$

$$Q_P = \sqrt{\frac{(C_3 + C_4)}{(C_1 + C_2)} \cdot \frac{g_{m1} \cdot g_{m2}}{g_{m4}^2}}$$

From Equations (12), it is understood that the parameters of pole point $Qp$ and zero point $Qn$ are determined depending on the capacitance ratio and the transconductance ratio, like the bell filter of FIG. 1, and thus that the construction of FIG. 4 is suitable for incorporation into ICs and accurate values are obtainable.

As a relation $\omega P = 107 \, N = \omega O$ is obtained when assuming that $Gm1 = Gm2 = Gm0$ and $C1 + C2 = C3 + C4 = C0$, the following parameters are given by following equations (13a) through (13h).

$$C_0 = \frac{g_{m0}}{\omega_0} \quad (13a)$$

$$C_1 = \frac{1}{Q_P} C_0 \quad (13b)$$

$$C_2 = \left(1 - \frac{1}{Q_P}\right) C_0 \quad (13c)$$

$$C_3 = \frac{Q_N}{Q_P} C_0 \quad (13d)$$

$$C_4 = \left(1 - \frac{Q_N}{Q_P}\right) C_0 \quad (13e)$$

$$g_{m1} = g_{m2} = g_{m0} \quad (13f)$$

$$g_{m3} = \frac{Q_N}{Q_P} g_{m0} \quad (13g)$$

$$g_{m4} = \frac{1}{Q_P} g_{m0} \quad (13h)$$

Now parasitic capacitances of FIG. 4 will be discussed.

In FIG. 4, high impedance positions are the signal passes. As parasitic capacitances occur at these high impedance positions, a parasitic capacitance Cp2 is formed in parallel with the capacitor C2 while a parasitic capacitance Cp4 is formed in parallel with the capacitor C4 as shown in FIG. 4. When such parasitic capacitances CP2 and CP4 are formed, the transfer function Tp(S) is expressed by the following equation:

$$T_p(S) = \frac{C_3}{C_3 + C_4 + C_{p4}} \times \quad (14)$$

$$\frac{S^2 + \frac{C_1 \cdot g_{m1}}{(C_1 + C_2 + C_{p2})C_3} S + \frac{g_{m1} \cdot g_{m3}}{(C_1 + C_2 + C_{p2})C_3}}{S^2 + \frac{g_{m4}}{C_3 + C_4 + C_{p4}} S + \frac{g_{m1} \cdot g_{m2}}{(C_1 + C_2 + C_{p2})(C_3 + C_4 + C_{p4})}}$$

Equation (14) is basically equal to Equation (11). That is, (C2+Cp2) in Equation (14) corresponds to C2 in Equation (11) while (C4+Cp2) in Equation (14) corresponds to C4 in Equation (11). This indicates that it is possible to remove the influence of the parasitic capacitances Cp2 and Cp4 by reducing the capacitances of the actual capacitics C2 and C4 by the parasitic capacitances Cp2 and Cp4.

When viewed from a different point, Equation (12) indicates that the natural pole and zero frequencies $\omega P$ and $\omega N$ are settable independently in the bell filter of FIG. 4 and the deviation of the transfer function caused by the parasitic capacitances Cp2 and Cp4 is adjusted to restore a prescribed characteristic.

Figure 5:
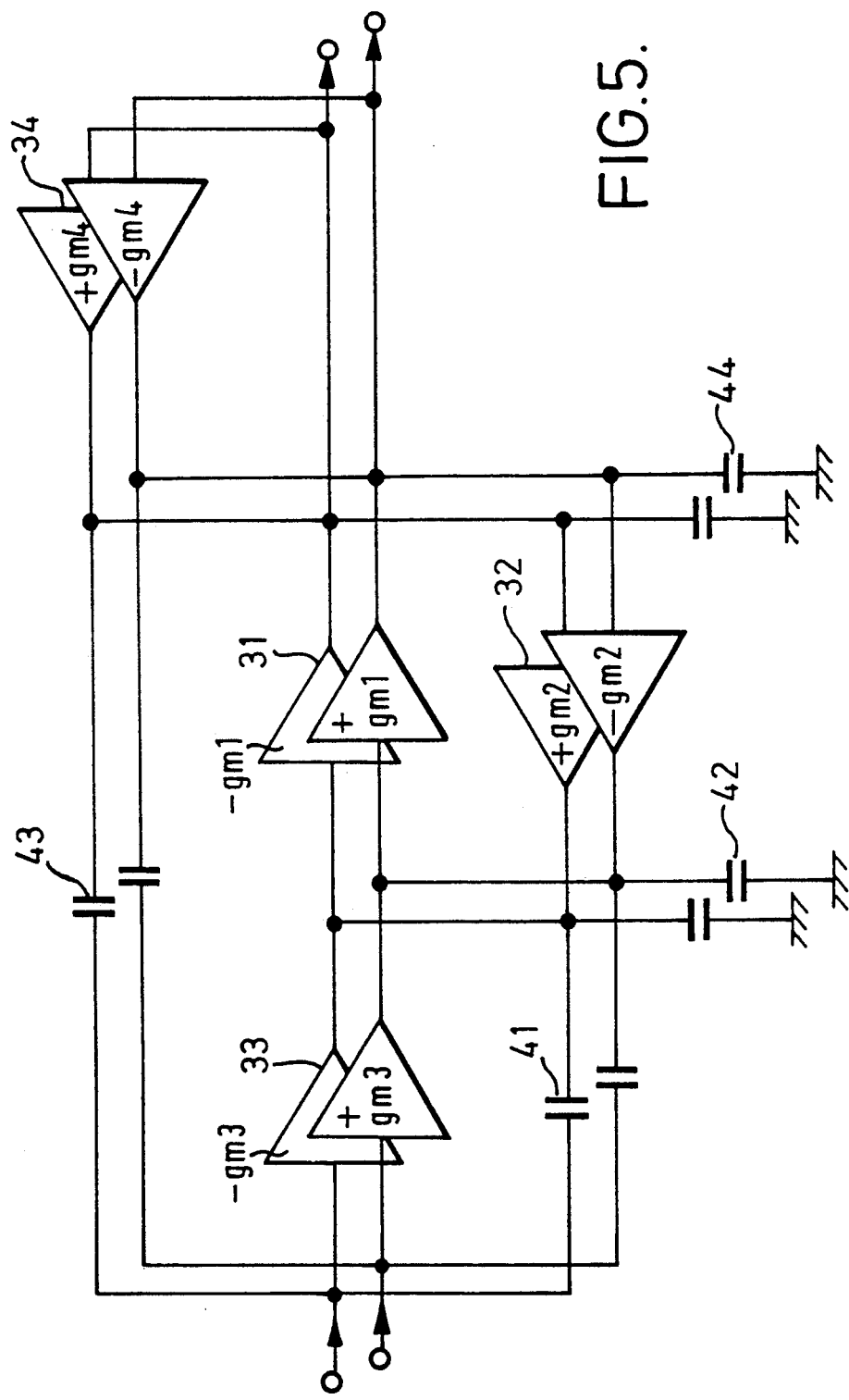
FIG. 5 is another circuit diagram showing the analog circuit of FIG. 3 with a differential arrangement.

FIG. 5 shows a modification of the bell filter of FIG. 4. In FIG. 5, the bell filter is constructed in the form of a full differential arrangement. According to such an arrangement, a differential circuit consisting of a pair of +Gm and −Gm amplifiers operates in a virtually grounded state. Therefore, its frequency characteristic is remarkably improved and the phase lag is greatly reduced. As a result, the bell filter of FIG. 5 operates almost ideally. The deviation of the filter characteristic is also reduced. Further, each pair of the capacitors 42 and 44 which are coupled to the ground circuit can be regarded as virtually grounded. Therefore, each of them can be realized by one capacitor. In this case, it is sufficient if one capacitor having a capacitance less than half of that shown in FIG. 5 is provided between the Gm amplfiers 31 and 32. This is further advantageous for implementing on ICs.

The bell filter of FIGS. 3, 4 and 5 has no impedance conversion circuit, as described above. Thus, the bell filter can avoid undesired ocillation, if the selectivity Q is especially high.

Further, there is an advantage in that the influence of the drive impedance of the bell filter is less even when the selectivity Q is high, because the capacitor C1 connected to the input terminal Tin is inversely proportional to Qp.

It is further advantageous that the bell filter of FIGS. 3 and 4 realizes the double second order function which is a regular form of second order transfer functions. This suggests that all the second order transfer functions can be accomplished in many filters, not only the bell filter of FIGS. 3 and 4.

Figure 6:
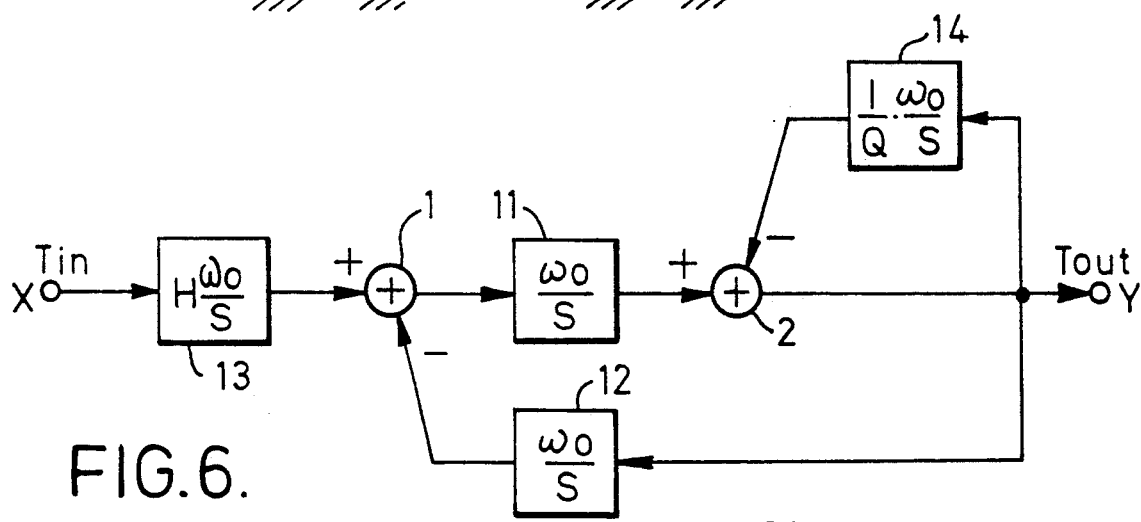
FIG. 6 is a functional illustration showing a low-pass filter as a second embodiment of the analog filter according to the present invention.
Figure 7:
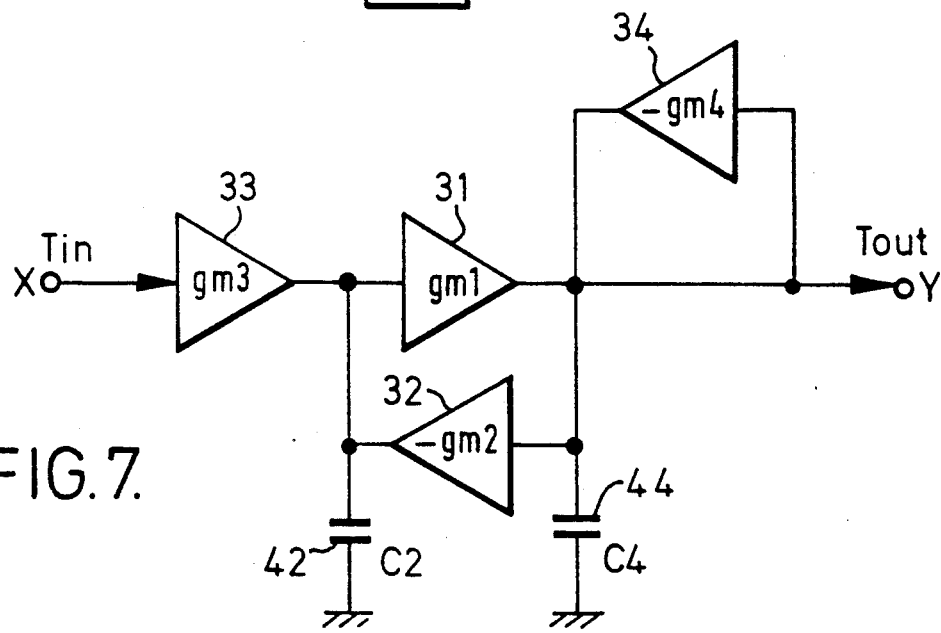
FIG. 7 is a circuit diagram showing the low-pass filter of FIG. 6.

A low-pass filter according to the present invention is shown in FIGS. 6 and 7. In FIGS. 6 and 7, respective elements which are similar to those in FIGS. 3 and 4 are assigned the same symbols as those shown in FIGS. 3 and 4. That is, in the low-pass filter of FIGS. 6 and 7 the coefficient function blocks 21 and 22 or the capacitors 41 and 43 from the bell filter of FIGS. 3 and 4 have been removed.

The transfer function TL(S) of the low-pass filter is expressed as follows:

$$T_L(S) = \frac{g_{m3}}{g_{m2}} \cdot \frac{\frac{g_{m1} \cdot g_{m2}}{C_2 \cdot C_4}}{S^2 + \frac{g_{m4}}{C_4} \cdot S + \frac{g_{m1} \cdot g_{m2}}{C_2 \cdot C_4}} \quad (15)$$

Figure 8:
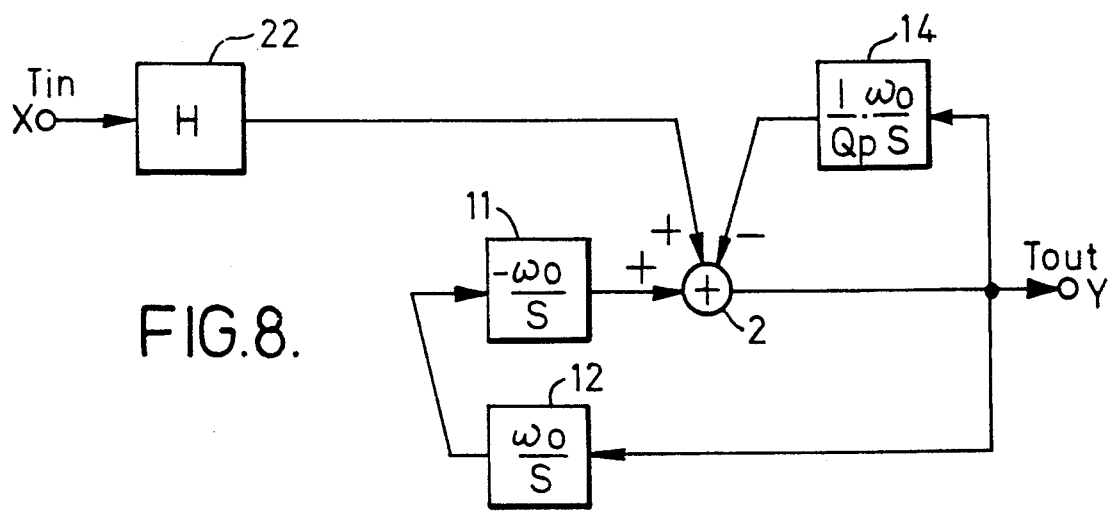
FIG. 8 is a functional illustration showing a high-pass filter as a third embodiment of the analog filter according to the present invention.
Figure 9:
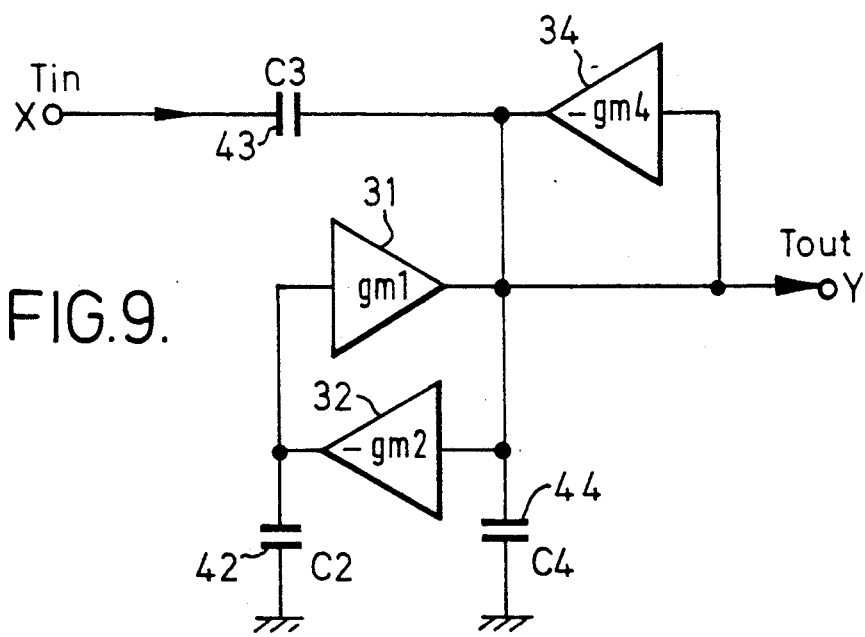
FIG. 9 is a circuit diagram showing the high-pass filter of FIG. 8.

A high-pass filter according to the present invention is shown in FIGS. 8 and 9. In FIGS. 8 and 9, respective elements which are also similar to those in FIGS. 3 and 4 are assigned the same symbols as those shown in FIGS. 3 and 4. That is, in the high-pass filter of FIGS. 8 and 9 the integrating function block 13 and the coefficient function block 21 or the front stage Gm amplifier 33 and the capacitor 41 from the bell filter of FIGS. 3 and 4 have been removed.

The transfer function TH(S) of the high-pass filter is expressed as follows:

$$T_H(S) = \frac{C_3}{C_3 + C_4} \cdot \frac{S^2}{S^2 + \frac{g_{m4}}{C_3 + C_4} S + \frac{g_{m1} \cdot g_{m2}}{C_2(C_3 + C_4)}} \quad (16)$$

Figure 10:
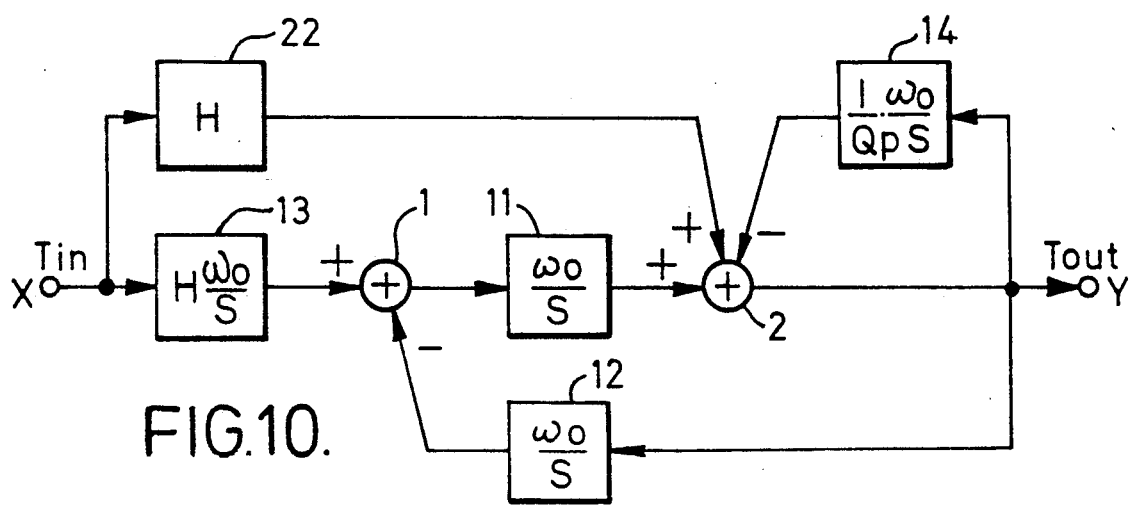
FIG. 10 is a functional illustration showing a notch filter as a fourth embodiment of the analog filter according to the present invention.
Figure 11:
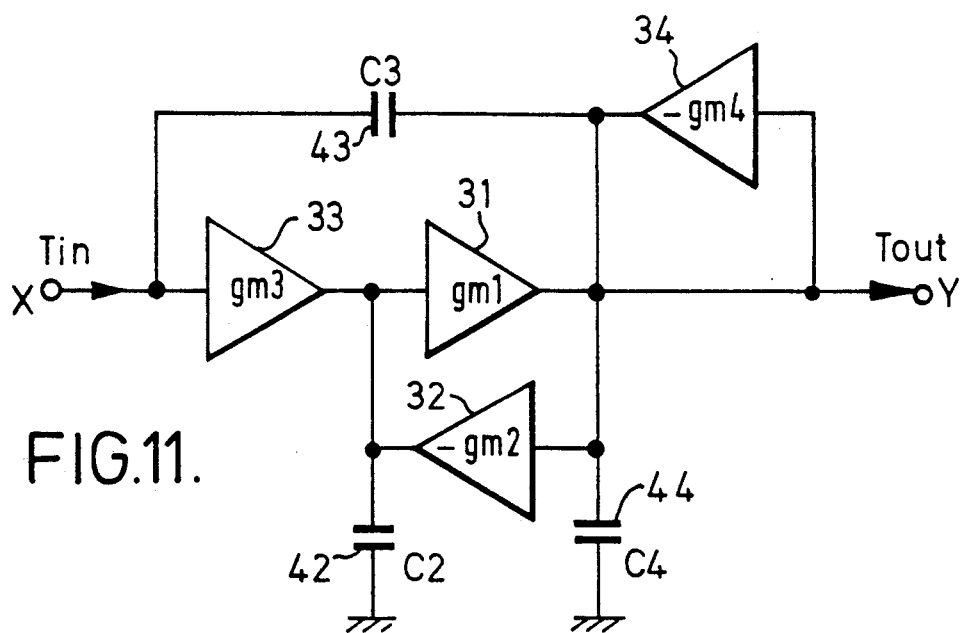
FIG. 11 is a circuit diagram showing the notch filter of FIG. 10.

A notch filter according to the present invention is shown in FIGS. 10 and 11. In FIGS. 10 anhd 11, respective elements which are also similar to those in FIGS. 3 and 4 are assigned with the same symbols as those shown in FIGS. 3 and 4. That is, in the notch filter of FIGS. 10 and 11 the coefficient function block 21 or the capacitor 41 from the bell filter of FIGS. 3 and 4 have been removed.

The transfer function TN(S) of the notch filter is expressed as follows:

$$T_N(S) = \frac{C_3}{C_3 + C_4} \cdot \frac{S^2 + \frac{g_{m1} \cdot g_{m3}}{C_2 \cdot C_3}}{S^2 + \frac{g_{m4}}{C_3 + C_4} S + \frac{g_{m1} \cdot g_{m2}}{C_2(C_3 + C_4)}} \quad (17)$$

Figure 12:
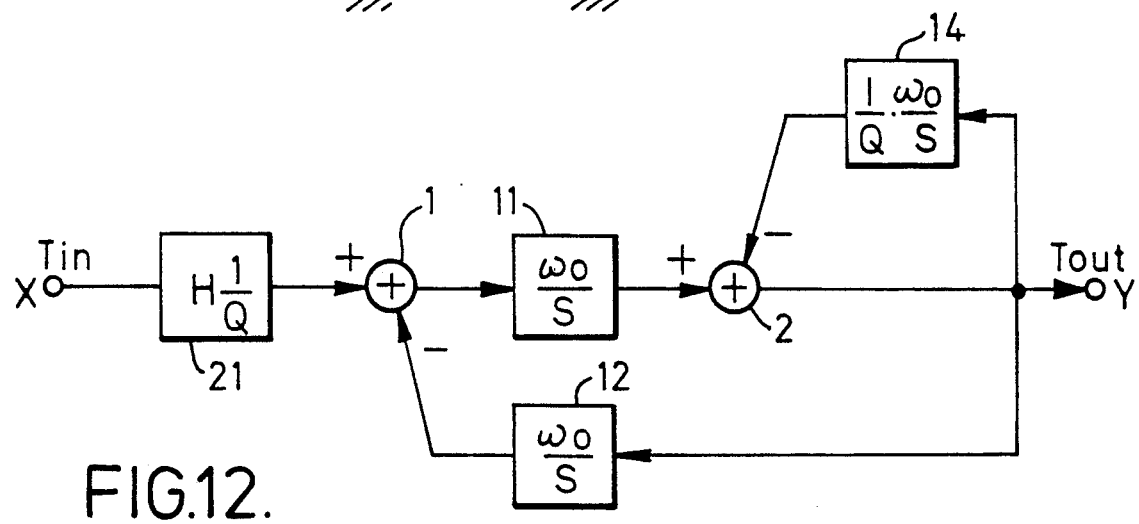
FIG. 12 is a functional illustration showing a band-pass filter as a fifth embodiment of the analog filter according to the present invention.
Figure 13:
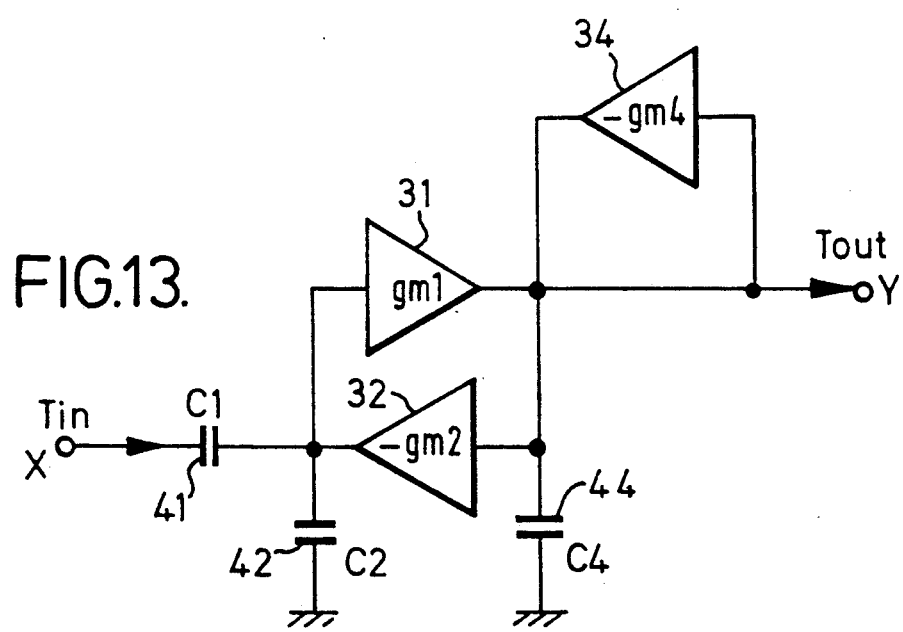
FIG. 13 is a circuit diagram showing the band-pass filter of FIG. 12.

A band-pass filter according to the present invention is shown in FIGS. 12 and 13. In FIGS. 12 and 13, respective elements which are also similar to those in FIGS. 3 and 4 are assigned the same symbols as those shown in FIGS. 3 and 4. That is, in the band-pass filter of FIGS. 12 and 13 the integrating function block 13 and the coefficient function block 22 or the front stage Gm amplifier 33 and the capacitor 43 from the bell filter of FIGS. 3 and 4 have been removed.

The transfer function TB(S) of the band-pass filter is expressed as follows:

$$T_B(S) = \frac{C_1 \cdot g_{m1}}{(C_1 + C_2) \cdot g_{m4}} \cdot \frac{\frac{g_{m4}}{C_4} S}{S^2 + \frac{g_{m4}}{C_4} S + \frac{g_{m1} \cdot g_{m2}}{(C_1 + C_2)C_4}} \quad (18)$$

Figure 14:
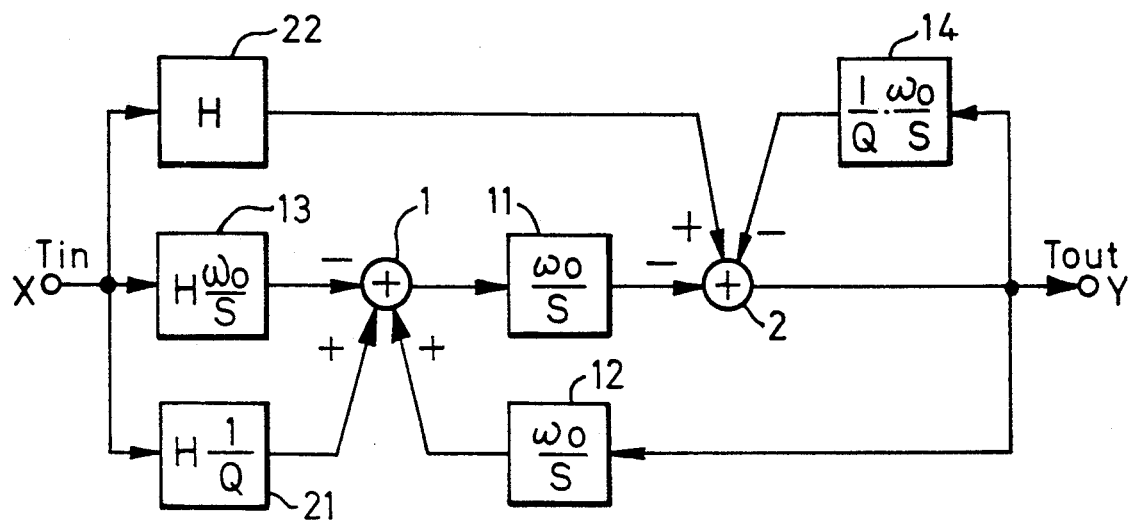
FIG. 14 is a functional illustration showing an all-pass filter as a sixth embodiment of the analog filter according to the present invention.
Figure 15:
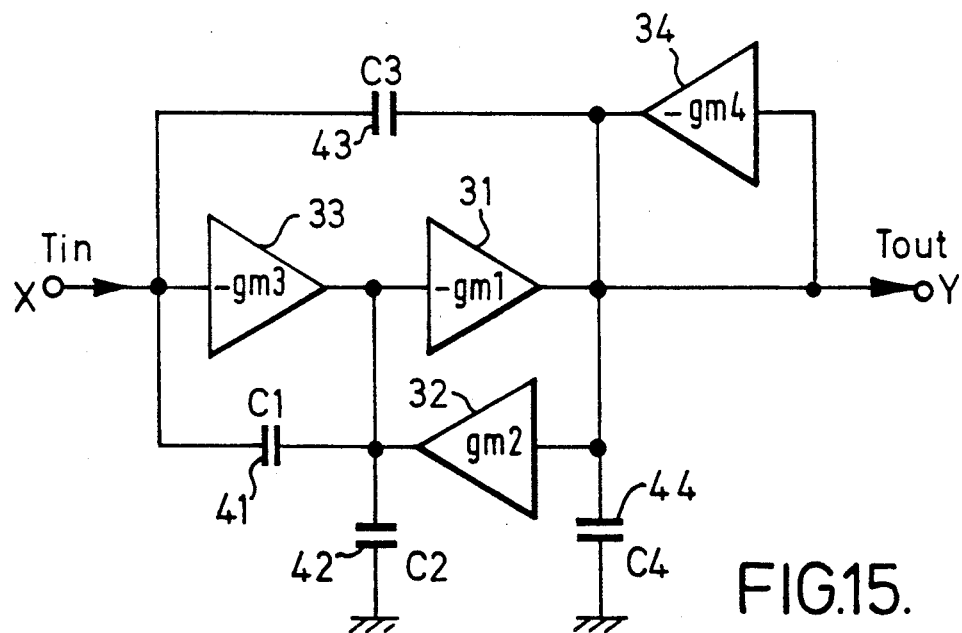
FIG. 15 is a circuit diagram showing the all-pass filter of FIG. 14.

An all-pass filter according to the present invention is shown in FIGS. 14 and 15. In FIGS. 14 and 15, respective elements which are also similar to those in FIGS. 3 and 4 are assigned the same symbols as those shown in FIGS. 3 and 4. However the first signal combining function block 1 combines the output from the first integrating function block 13 and signals from the passes L12 and L13 together, wherein the signal from the integrating function block 13 is applied to the first signal combining function block 1 in the opposite phase to the phase of the other two signals. The fourth integrating function block 11 integrates the output from the first signal combining function block 1. Also the second signal combining function block 2 combines the output from the fourth integrating function block 11 and signals from the passes L11 and L14 together, wherein the signals from the pass L14 and the integrating function block 11 are applied to the second signal combining function block 2 in the opposite phase to the phase of the other signal from the coefficient function block 22.

In the expression as shown in FIG. 15, the transconductance of the second Gm amplifier 32 is expressed in the positive expression, while the transconductances of the first, third and fourth Gm amplifiers 33, 34 and 31 are expressed in the negative expression.

The transfer function TA(S) of the all-pass filter is expressed as follows:

$$T_A(S) = \frac{C_3}{C_3 + C_4} \cdot \frac{S^2 - \frac{C_1 \cdot g_{m1}}{(C_1 + C_2)C_3} S + \frac{g_{m1} \cdot g_{m3}}{(C_1 + C_2)C_3}}{S^2 + \frac{g_{m4}}{C_3 + C_4} S + \frac{g_{m1} \cdot g_{m2}}{(C_1 + C_2)(C_3 + C_4)}} \quad (19)$$

Thus, the transfer functions of the above embodiments are accomplished with all the second order transfer functions.

Further, in each embodiment the passes to which the coefficient function blocks o capacitors are connected are changed depending on transconductances of the Gm amplfiers and, in the case where a gain of the coefficient function block is 1, they are shown simply as passes on the drawings.

As described above, the present invention can provide an extremely preferable analog filter.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefore, it is intended that the present invention not be limited to the particular embodiment disclosed as the best mode contemplated for carrying out the present invention, but that the present invention include all embodiments falling within the scope of the appended claims.

What is claimed is:

1. An analog active filter for realizing the secondary transfer function by using an amplifier having a feedback loop, comprising:

first integrating means for integrating an input signal;
second and third integrating means for integrating an output signal;
first signal combining means for combining signals from the first and second integrating means with the input signal;
fourth integrating means for integrating signals from the first signal combining means; and second signal combining means for combining signals from the third and fourth integrating means with the input signal and deriving the output signal.

2. An analog low-pass filter for realizing the secondary transfer function by using an amplifier having a feedback loop, comprising:
   first integrating means for integrating an input signal;
   second and third integrating means for integrating an output signal;
   first signal combining means for combining signals from the first and second integrating means;
   fourth integrating means for integrating a signal from the first signal combining means; and
   second signal combining means for combining signals from the third and fourth integrating means and deriving the output signal.

3. An analog high-pass filter for realizing the secondary transfer function by using an amplifier having a feedback loop, comprising:
   first and second integrating means for integrating an output signal;
   third integrating means for integrating a signal from the second integrating means; and
   signal combining means for combining signals from the first and third integrating means with an input signal and deriving the output signal.

4. An analog notch filter for realizing the secondary transfer function by using an amplifier having a feedback loop, comprising:
   first integrating means for integrating an input signal;
   second and third integrating means for integrating an output signal;
   first signal combining means for combining signals from the first and second integrating means;
   fourth integrating means for integrating a signal from the first signal combining means; and
   second signal combining means for combining signals from the third and fourth integrating means with the input signal and deriving the output signal.

5. An analog band-pass filter for realizing the secondary transfer function by using an amplifier having a feedback loop, comprising:
   first and second integrating means for integrating an output signal;
   first signal combining means for combining an input signal and a signal from the second integrating means;
   third integrating means for integrating a signal from the first signal combining means; and
   second signal combining means for combining signals from the first and third integrating means and deriving the output signal.

6. An analog all-pass filter for realizing the secondary transfer function by using an amplifier having a feedback loop, comprising:
   first integrating means for integrating an input signal;
   second and third integrating means for integrating an output signal;
   first signal combining means for combining signals from the first and second integrating means with the input signal;
   fourth integrating means for integrating signals from the first signal combining means; and
   second signal combining means for combining signals from the third and fourth integrating means with the input signal and deriving the output signal.

* * * * *